United States Patent

Iio et al.

[11] Patent Number: 6,016,090
[45] Date of Patent: Jan. 18, 2000

[54] DIELECTRIC RESONATOR APPARATUS AND HIGH-FREQUENCY MODULE

[75] Inventors: Kenichi Iio, Nagaokakyo; Koichi Sakamoto, Ohtsu; Sadao Yamashita, Kyoto; Toshihiro Hiratsuka, Kusatsu; Tomiya Sonoda, Muko; Shigeyuki Mikami, Shiga-ken, all of Japan

[73] Assignee: Murata Manufacturing Co., Ltd., Japan

[21] Appl. No.: 08/965,464

[22] Filed: Nov. 6, 1997

[30] Foreign Application Priority Data

Nov. 6, 1996 [JP] Japan .................................. 8-294087

[51] Int. Cl.$^7$ ...................................................... H01P 7/10
[52] U.S. Cl. ...................... 333/202; 333/134; 333/219.1; 331/96; 331/107 DP
[58] Field of Search ..................................... 333/202, 204, 333/219, 219.1, 134; 331/96, 107 DP

[56] References Cited

U.S. PATENT DOCUMENTS

| | | | |
|---|---|---|---|
| 3,688,225 | 8/1972 | Cohn | 333/204 |
| 4,575,699 | 3/1986 | Lockwood | 333/219.1 |
| 5,786,740 | 7/1998 | Ishikawa et al. | 333/219.1 |

FOREIGN PATENT DOCUMENTS

| | | |
|---|---|---|
| 0734088 | 3/1996 | European Pat. Off. . |
| 54-23448 | 2/1979 | Japan .................................. 333/219.1 |

OTHER PUBLICATIONS

Ishikawa Y et al.: "Planar Type Dielectric Resonator Filter at Millimeter–Wave Frequency" IEICE Transactions on Electronics, vol. E79–C, No. 5, May 1, 1996, pp. 679–684, XP000621611, *p. 682, left–hand column, line 14—right–hand column, line 10: figures 9,10.

Patent Abstracts of Japan, vol. 96, No. 7, Jul. 31, 1996 & JP 08 078903 A (UBE IND LTD), Mar. 22, 1996 *abstract*.

European Search Report dated February 17, 1998.

*Primary Examiner*—Seungsook Ham
*Attorney, Agent, or Firm*—Ostrolenk, Faber, Gerb & Soffen, LLP

[57] ABSTRACT

A dielectric substrate is provided on both its main surfaces with conductors each having two circular openings such that the openings on both main surfaces oppose each other. On one conductor of the dielectric substrate, an insulating layer is formed. On the insulating layer, an input electrode and an output electrode are formed. Electrically conductive plates are disposed and secured such that they sandwich the dielectric substrate with gaps therebetween.

34 Claims, 8 Drawing Sheets

DIELECTRIC RESONATOR APPARATUS AND HIGH-FREQUENCY MODULE

BACKGROUND OF THE INVENTION

1. Field of the Invention

The present invention relates to a dielectric resonator apparatus for use in the microwave and millimeter-wave frequency bands, such as a dielectric filter, a voltage-controlled oscillator, or a dielectric duplexer, and to a high-frequency module using such a dielectric resonator apparatus.

2. Description of the Related Art

Large-capacity, high-speed communication systems are required in response to the rapid increase in demands for a mobile communication system and the use of multimedia in the system. As the amount of information to be communicated has been expanded, the frequency band in use has been extended from the microwave frequency band to the millimeter-wave frequency band. In the millimeter-wave frequency band, a $TE_{01\delta}$-mode dielectric resonator, which has been known conventionally and is formed of a column-shaped dielectric, can be used in the same way as in the microwave frequency band. Since the frequency of a general $TE_{01\delta}$-mode dielectric resonator is determined by the exterior dimensions of its column-shaped dielectric, fine machining precision is required. When a dielectric filter is made by disposing a plurality of $TE_{01\delta}$-mode dielectric resonators at a specified interval in a metallic case, since the coupling between a dielectric resonator and input and output means such as a metal loop, or the coupling between a dielectric resonator and another dielectric resonator is determined by the distance therebetween, highly precise arrangement is required.

The applicant of the present invention has proposed a dielectric resonator and a dielectric filter having fine machining precision for solving these problems, in Japanese Patent Application No. 7-62625.

FIG. 5 is an exploded perspective view of a dielectric filter according to the foregoing application.

As shown in FIG. 5, a dielectric filter 101 includes a dielectric substrate 102 and electrically conductive plates 103a and 103b.

The dielectric substrate 102 has a certain relative dielectric constant. It is provided on both its main surfaces with conductors 102a and 102b both having two circular openings such that the openings are opposed to each other.

On the surface (the upper surface in FIG. 5) close to the conductor 102a of the dielectric substrate 102, an input coplanar line 104a and an output coplanar line 104b are formed such that they are disposed close to the two openings.

The electrically conductive plates 103a and 103b are disposed and secured such that they sandwich the dielectric substrate 102 with gaps provided from the dielectric substrate 102 near the openings. The input coplanar line 104a and the output coplanar line 104b protrude from the electrically conductive plates 103a and 103b. The electrically conductive plate 103a is provided with grooves such that it is not connected to the input coplanar line 104a and the output coplanar line 104b. The electrically conductive plate 103a is electrically connected to the conductor 102a of the dielectric substrate 102, and the electrically conductive plate 103b is electrically connected to the conductor 102b of the dielectric substrate 102.

With this structure, electromagnetic energy is trapped in the dielectric substrate 102 near the portions sandwiched by the openings of the opposing conductors 102a and 102b to form two resonant zones. Each resonant zone serves as an independent resonator, and the adjacent resonators are coupled to form a filter having two resonator stage.

As described above, since the resonant zones are specified by the size of the openings of the conductors, etching and other methods can be used in manufacturing, and a dielectric resonator can be created in which required precision in the dimensions of a resonator in relation to a frequency is satisfied with extreme accuracy. The input and output means and a dielectric resonator, or a dielectric resonator and another dielectric resonator can be disposed with a high positional precision to obtain the desired coupling strength.

In the dielectric filter 101, since the resonators formed of the dielectric substrate 102 sandwiched by the openings of the opposing conductors 102a and 102b have a high capability of trapping electromagnetic energy, when an input and output means is formed of the coplanar lines 104a and 104b, the coupling between the resonators and the input and output means is weak and that coupling is strengthened by making the distance from the openings of the conductors 102a and 102b to the coplanar lines 104a and 104b as narrow as possible.

A voltage-controlled oscillator has also been known conventionally as an apparatus using a dielectric resonator. FIG. 6 shows a voltage-controlled oscillator.

As shown in FIG. 6, a voltage-controlled oscillator 111 uses a column-shaped $TE_{01\delta}$-mode dielectric resonator 112.

The $TE_{01\delta}$-mode dielectric resonator 112 is disposed on a printed circuit board 113 through a support base 112a having a low dielectric constant. On the lower surface of the printed circuit board 113, a ground electrode (not shown) is formed. The printed circuit board 113 is covered by an upper metal case 130 and a lower metal case 131.

On the printed circuit board 113, a microstripline 114 serving as a main line and a microstripline 115 serving as a sub line are formed such that the $TE_{01\delta}$-mode dielectric resonator 112 overlaps with them in the vertical direction in the figure.

The microstripline 114 is connected to a ground electrode 117 through a chip resistor 116 at one end, and is connected to the gate of a field effect transistor 118 at the other end.

The microstripline 115 is connected to the ground electrode 117 through a varactor diode 119 at one end, and the other end serves as an open end.

The field effect transistor 118 is connected to an input electrode 122 through a microstripline 121 at its drain, and is connected to one end of a microstripline 123 at its source.

The input electrode 122 is connected to a chip capacitor 120 in parallel to the microstripline 121.

The microstripline 121 is connected to a matching stub 124 at the connection point with the drain of the field effect transistor 118.

The microstripline 123 is connected to the ground electrode 117 through a chip resistor 125 at the other end. The microstripline 123 is formed at the middle in parallel to a microstripline 126 at a certain distance such that they are electromagnetically coupled.

The microstripline 126 is connected to an output electrode 128 through a chip resistor 127.

The output electrode 128 is connected to a chip capacitor 129 in parallel to the chip resistor 127.

With the above configuration, the varactor diode 119 changes its capacitance according to an applied voltage, and hence the resonant frequency of the $TE_{01\delta}$-mode dielectric resonator 112 is changed and the oscillation frequency changes.

As described above, in the dielectric filter 101 shown in FIG. 5, since the coupling between the coplanar lines 104a and 104b and the resonators formed of the openings of the conductors 102a and 102b is weak, the coupling between the resonators and the input and output means is strengthened by making the distance from the openings of the conductors 102a and 102b to the coplanar lines 104a and 104b as narrow as possible. If the openings of the conductors 102a and 102b join exposed portions of the dielectric substrate close to the coplanar lines 104a and 104b, the electromagnetic fields of the resonators are disarranged and the filter characteristics may change. Therefore, the distance between the openings of the conductors 102a and 102b and the coplanar lines 104a and 104b is limited.

The input and output coplanar lines 104a and 104b are formed on one main surface of the substrate 102. Since the length of the substrate extends in the direction in which the resonators are arranged, the dielectric filter 101 also becomes long. Therefore, the space for input and output means such as the coplanar lines 104a and 104b prevents the dielectric filter 101 from being made compact.

In the voltage-controlled oscillator 111 shown in FIG. 6, the strength of the coupling between the $TE_{01\delta}$-mode dielectric resonator 112 and the microstripline 114 serving as the main line and that between the resonator and the microstripline 115 serving as a sub line are determined by the relative distance between the $TE_{01\delta}$-mode dielectric resonator 112 and the microstripline 114 and that between the resonator and the microstripline 115. Therefore, the $TE_{01\delta}$-mode dielectric resonator 112, the microstripline 114, and the microstripline 115 need to be disposed with a high precision.

Since the electromagnetic field of the $TE_{01\delta}$-mode dielectric resonator 112 expands widely around the $TE_{01\delta}$-mode dielectric resonator 112, it may couple with microstriplines other than the microstriplines 114 and 115, such as the microstriplines 121 and 123. This unnecessary coupling may make the oscillation frequency of the voltage-controlled oscillator 111 unstable. Conventionally, to suppress problems caused by such coupling, patterns are designed such that the microstriplines 121 and 123, which are not to be coupled with the $TE_{01\delta}$-mode dielectric resonator 112, are disposed as far as possible from the $TE_{01\delta}$-mode dielectric resonator 112.

Placing the microstriplines as far as possible from the $TE_{01\delta}$-mode dielectric resonator 112, however, means that the printed circuit board 113 becomes large, and as a result, the voltage-controlled oscillator 111 itself also becomes large.

In addition, since patterns are designed under the condition that the microstriplines 121 and 123, which are not to be coupled with the $TE_{01\delta}$-mode dielectric resonator 112, are disposed as far as possible from the $TE_{01\delta}$-mode dielectric resonator 112, the pattern design has a low degree of freedom.

The $TE_{01\delta}$-mode dielectric resonator 112 is disposed on the printed circuit board 113, and the printed circuit board 113 is covered by the upper metallic case 130 so that the electromagnetic field of the $TE_{01\delta}$-mode dielectric resonator 112 is trapped. Since the height of the upper metallic case 130 needs to be made larger than that of the $TE_{01\delta}$-mode dielectric resonator 112, the height of the voltage-controlled oscillator also becomes large.

SUMMARY OF THE INVENTION

The present invention is made to solve such problems. Accordingly, it is an object of the present invention to provide a dielectric resonator apparatus which can be made compact as a whole and in which input and output means and a transmission line can be strongly coupled with the dielectric resonator easily with high positional precision, and patterns are designed with a high degree of freedom, and to provide a high-frequency module using the dielectric resonator.

The above object is achieved in one aspect of the present invention through the provision of a dielectric resonator apparatus including: a dielectric substrate; a first conductor formed on one main surface of the dielectric substrate; a second conductor formed on the other main surface of the dielectric substrate; a first opening formed in the first conductor such that the dielectric substrate is exposed through the first conductor; a second opening formed in the second conductor such that the dielectric substrate is exposed through the second conductor and opposed to the first opening with the dielectric substrate being sandwiched therebetween; a first electrically conductive plate disposed with a gap from the first conductor so as to cover at least the first opening; a second electrically conductive plate disposed with a gap from the second conductor so as to cover at least the second opening; an insulating member formed on at least one of the first conductor and the second conductor; and an electrode formed on the insulating member.

Since the electrode is spaced from the first or second conductor by the insulating member on the dielectric substrate, the distance between the resonator and the electrode can be fixed.

In the dielectric resonator apparatus, the insulating member may be formed of a thin film.

By forming the insulating member with a thin film, the positional relationship between the resonator and the electrode can be specified with high precision.

In the dielectric resonator apparatus, the electrode may be formed so as to overlap with at least one of the first opening and the second opening.

Since the electrode is spaced by the insulating member from the resonator formed of the dielectric substrate positioned between the first opening formed on the first conductor and the second opening formed on the second conductor, the coupling between the resonator and the electrode can be increased.

In the dielectric resonator apparatus, the insulating member may be made from a material having a lower dielectric constant than that of the dielectric substrate.

Since the insulating member is made from a material having a lower dielectric constant than that of the dielectric substrate, an additional stray capacitance is prevented from being generated between the conductors formed on the dielectric substrate and the electrode on the insulating member.

The dielectric resonator apparatus may be configured such that the second electrically conductive plate includes: a first ceramic substrate in which an external terminal is formed, a recessed portion is formed at a position different from the external terminal, and an electrically conductive member is formed at the bottom of the recessed portion as a minimum; a second ceramic substrate which has a hole larger than the recessed portion of the first ceramic substrate and which is laminated on the first ceramic substrate such that the external terminal and the recessed portion of the first ceramic substrate are exposed by the hole; and an accommodation section formed of the recessed portion of the first ceramic substrate and the hole of the second ceramic substrate, the dielectric substrate being accommodated therein with the surface on which the wiring electrode is formed being placed downward such that a part of the wiring electrode is directly connected to the external terminal.

The ceramic package having the external terminal serves as the second conductor plate. Since a part of the wiring electrode formed on the insulating substrate is directly connected to the external terminal of the ceramic package, connecting wire and other components become unnecessary and unwanted inductance can be eliminated at high frequencies.

The above object is achieved in another aspect of the present invention through the provision of a high-frequency module including: a dielectric substrate; a first conductor formed on one main surface of the dielectric substrate; a second conductor formed on the other main surface of the dielectric substrate; a first opening formed in the first conductor; a second opening formed in the second conductor and opposed to the first opening with the dielectric substrate being sandwiched therebetween; a first electrically conductive plate disposed with a gap from the first conductor so as to cover at least the first opening; a second electrically conductive plate disposed with a gap from the second conductor so as to cover at least the second opening; an insulating member formed on at least one of the first conductor and the second conductor; a wiring electrode formed on the insulating member; and an electronic component disposed on and connected to the wiring electrode.

Since the dielectric substrate serving as the resonator is used as a wiring substrate and its wiring electrode is connected to the electronic component, the high-frequency module can be integrated.

In the high-frequency module, the insulating member may be formed of a thin film.

Since the insulating member is formed of a thin film, the positional relationship between the resonator and the electrode can be specified with high precision.

In the high-frequency module, the electrode may be formed so as to overlap with at least one of the first opening and the second opening.

Since the electrode is formed through the insulating member on the resonator formed of the dielectric substrate positioned between the first opening formed on the first conductor and the opening of the second conductor, the coupling between the resonator and the electrode can be increased.

In the high-frequency module, the insulating member may be made from a material having a lower dielectric constant than that for the dielectric substrate.

Since the insulating member is made from a material having a lower dielectric constant than that for the dielectric substrate, an additional stray capacitance is prevented from being generated between the conductors formed on the dielectric substrate and the electrode on the insulating member.

The high-frequency module may be configured such that the second electrically conductive plate includes: a first ceramic substrate in which an external terminal is formed, a recessed portion is formed at a position different from the external terminal, and an electrically conductive member is formed at the bottom of the recessed portion as a minimum; a second ceramic substrate which has a hole larger than the recessed portion of the first ceramic substrate and which is laminated on the first ceramic substrate such that the external terminal and the recessed portion of the first ceramic substrate are exposed by the hole; and an accommodation section formed of the recessed portion of the first ceramic substrate and the hole of the second ceramic substrate, the dielectric substrate being accommodated therein with the surface on which the wiring electrode is formed being placed downward such that a part of the wiring electrode is directly connected to the external terminal.

The ceramic package having the external terminal serves as the second conductor plate. Since a part of the wiring electrode formed on the insulating substrate is directly connected to the external terminal of the ceramic package, connecting wire and other components become unnecessary and unwanted inductance can be eliminated at high frequencies.

As described above, in the present invention, since an electrode is provided on an insulating member formed on a dielectric substrate in which a resonator is formed, the distance between the resonator and the electrode can be fixed, and a dielectric resonator apparatus in which the positional relationship between the resonator and the electrode is highly precisely specified can be obtained.

By using an electrode formed on the insulating member as a wiring pattern, the dielectric resonator apparatus can be integrated. Therefore, a high-frequency module such as a transmission and receiving module can be made compact.

DESCRIPTION OF THE PREFERRED EMBODIMENTS

Figure 1:
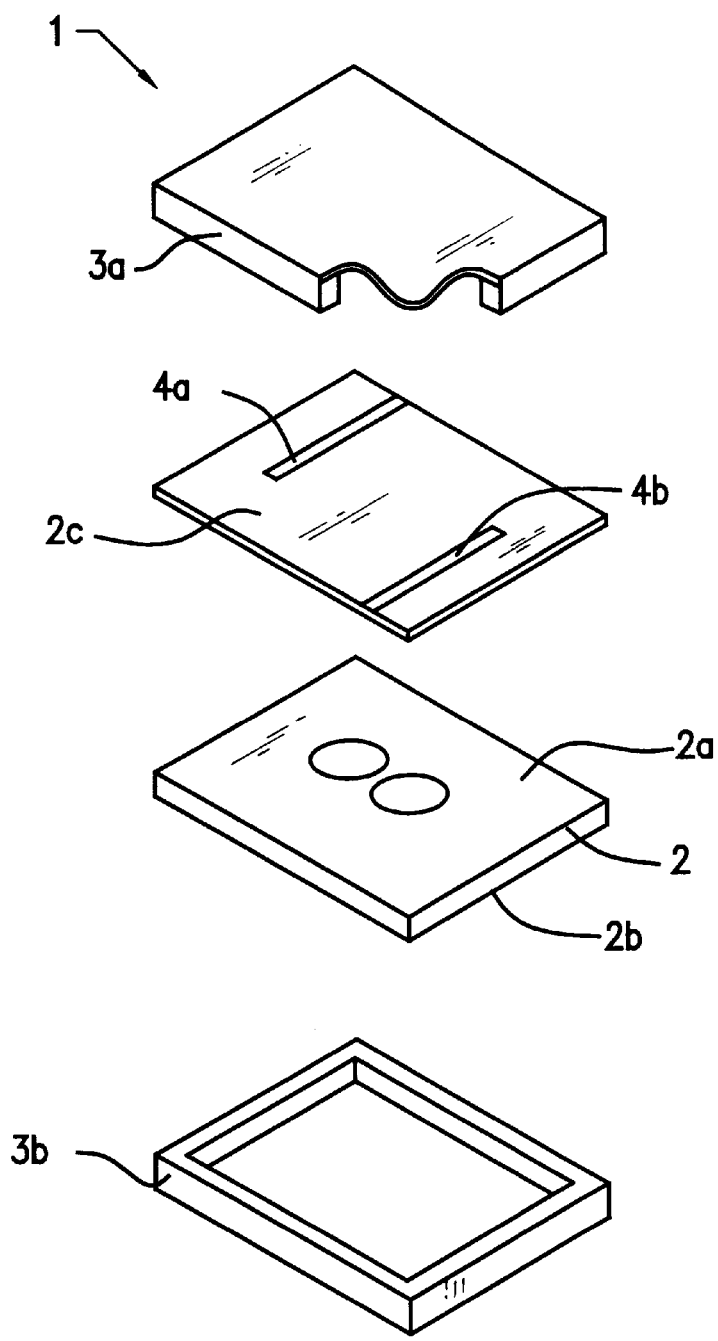
FIG. 1 is an exploded perspective view of a dielectric filter according to a first embodiment of the present invention.

Embodiments of the present invention will be described below by referring to the drawings.

FIG. 1 is an exploded perspective view of a dielectric filter according to a first embodiment of the present invention.

As shown in FIG. 1, a dielectric filter 1 includes a dielectric substrate 2 and electrically conductive plates 3a and 3b.

The dielectric substrate 2 has a certain relative dielectric constant. It is provided on both its main surfaces with conductors 2a and 2b both having two circular openings such that the openings on both main surfaces are opposed to each other. The sizes of the openings of the conductors 2a and 2b on the dielectric substrate 2 are set according to the specified frequency.

On the conductor 2a of the dielectric substrate 2, an insulating layer 2c is formed by a thin-film forming technology. The insulating layer 2c is made from a material having a low dielectric constant, such as polytetrafluoroethylene. On the insulating layer 2c, an input electrode 4a and an output electrode 4b are formed.

The electrically conductive plates 3a and 3b are disposed and secured such that they sandwich the dielectric substrate 2 with gaps therebetween provided at a portion including the openings. The input electrode 4a and the output electrode 4b are insulated from the electrically conductive plates 3a and 3b, but led under them.

With this structure, since the openings and the dielectric substrate sandwiched thereby serve as resonators, a dielectric filter 1 having two resonator stages is obtained. Since in the structure of the present embodiment the input and output electrodes are disposed closer to the openings than in a conventional structure, stronger input and output coupling is obtained. Because the insulating layer 2c is formed of thin film, its thickness can easily be controlled and the distance from the input and output electrodes to the resonators can be set with high precision. Since the insulating layer is made from a material having a low dielectric constant such as polytetrafluoroethylene as compared with the dielectric substrate having a high dielectric constant, the deterioration of the characteristics caused by unnecessary coupling between the conductors and the input and output electrodes can be prevented.

The dielectric filter having a two-stage resonator has been described by referring to FIG. 1. The present invention is not limited to this filter. The present invention can also be applied to a dielectric filter having one resonator stage, three resonator stages, or more.

Figure 2:
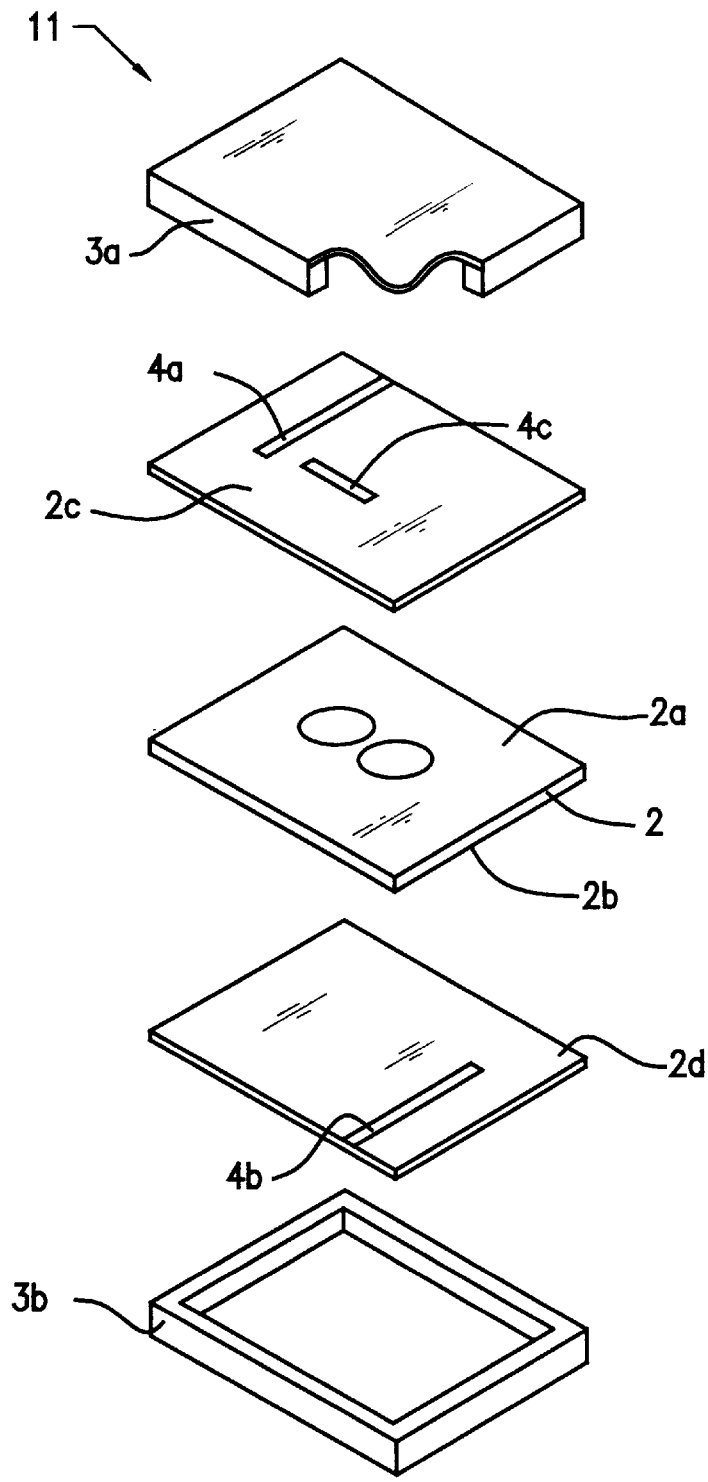
FIG. 2 is an exploded perspective view of a dielectric filter modified from that of the first embodiment.

In FIG. 1, the insulating layer 2c is formed only on the conductor 2a of the dielectric substrate 2. The present invention is not limited to this structure. As shown in FIG. 2, for example, an insulating layer 2d may be formed on the conductor 2b of the dielectric substrate 2.

FIG. 2 is an exploded perspective view of a dielectric filter 11 in which insulating layers 2c and 2d are formed on both conductor 2a and conductor 2b of a dielectric substrate 2. The same symbols as those used in FIG. 1 are assigned to the same portions as those shown in FIG. 1, and detailed descriptions thereof are omitted.

As shown in FIG. 2, the dielectric filter 11 differs from the filter shown in FIG. 1 in that the insulating layer 2d is formed and a coupling-adjustment electrode 4c is formed on an insulating layer 2c.

The conductors 2a and 2b are formed on both main surfaces of the dielectric substrate 2 such that the openings on both main surfaces are opposed to each other. The sizes of the openings of the conductors 2a and 2b on the dielectric substrate 2 are set according to the specified frequency.

The insulating layer 2c is formed on the conductor 2a of the dielectric substrate 2, and an input electrode 4a is formed on the insulating layer 2c. The insulating layer 2d is formed on the conductor 2b of the dielectric substrate 2, and an output electrode 4b is formed on the insulating layer 2d.

On the insulating layer 2c, the coupling electrode 4c is formed such that it overlaps with the two openings of the conductor 2a.

Since the input electrode 4a and the output electrode 4b are formed on different surfaces of the dielectric substrate 2, the input and output electrodes 4a and 4b are prevented from being electromagnetically coupled. The coupling between the two resonators is increased by the formed coupling electrode 4c. By adjusting the size of the coupling electrode 4c, the coupling between the resonators can be set to any strength.

Figure 3:
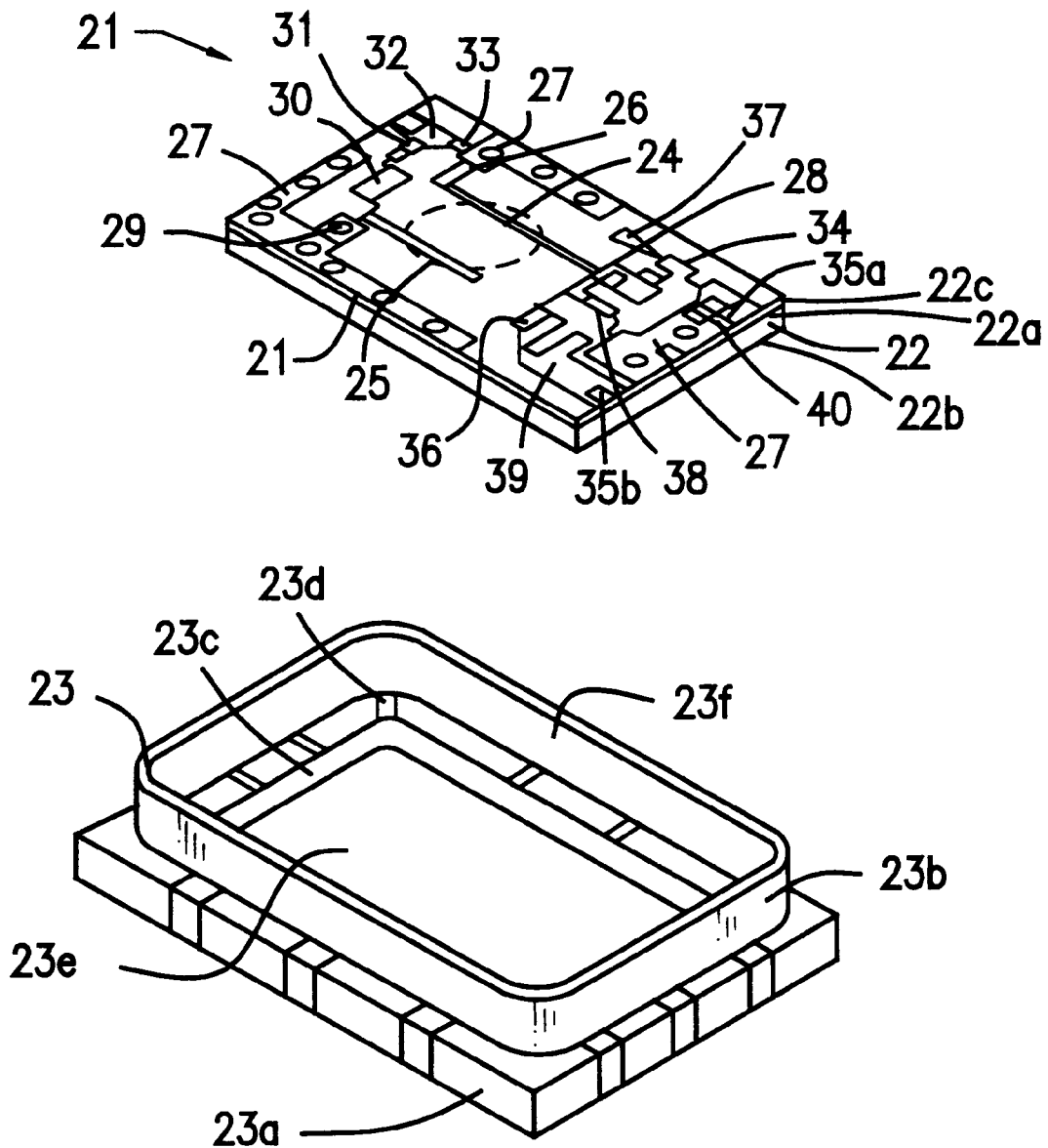
FIG. 3 is an exploded perspective view of a voltage-controlled oscillator according to a second embodiment.

FIG. 3 is an exploded perspective view of a voltage-controlled oscillator according to a second embodiment of the present invention.

As shown in FIG. 3, a voltage-controlled oscillator 21 is formed of a dielectric substrate 22 and a ceramic package 23.

On both main surfaces of the dielectric substrate 22 having a certain dielectric constant, electrodes 22a and 22b each having one circular opening are formed such that the openings on both main surfaces oppose each other.

The sizes of the openings of the conductors 22a and 22b of the dielectric substrate 22 are set according to the specified frequency. On the conductor 22a of the dielectric substrate 22, an insulating layer 22c having a low dielectric constant, such as polytetrafluoroethylene, is formed.

On the insulating layer 22c, a microstripline 24 serving as a main line and a microstripline 25 serving as a sub line are formed such that they overlap the opening of the conductor 22a in the vertical direction in the figure.

The microstripline 24 is connected to a ground electrode 27 through a resistor film 26 at one end, and is connected to the gate of a field effect transistor 28 at the other end.

The microstripline 24 constituting the main line is electromagnetically coupled with a resonant section formed of the openings of the conductors 22a and 22b and the portion sandwiched therebetween in the dielectric substrate to form a feedback circuit.

The microstripline 25 is connected to the ground electrode 27 through a varactor diode 29 at one end, and the other end serves as an open end. At the connection end of the microstripline 25 to the varactor diode 29, an inductor 30 is connected in parallel. The inductor 30 is connected through a resistor film 31 to a bias electrode 32 for applying a bias voltage. The bias electrode 32 is connected through a resistor film 33 to the ground electrode 27.

The microstripline 25 constituting the sub line and the varactor diode 29 form a variable oscillating-frequency circuit.

The field effect transistor 28 is connected to an input electrode 35a through a microstripline 34 at the drain, and is connected to one end of a microstripline 36 at the source. The input electrode 35a is connected to the ground electrode 27 through a chip capacitor 40, in parallel to the microstripline 34.

The microstripline 34 is connected to a matching stub 37 at the connection point to the drain of the field effect transistor 28.

The other end of the microstripline 36 is connected to the ground electrode 27 through a resistor film 38 at the connection point to the source of the field effect transistor 28. The microstripline 36 is formed in parallel to a microstripline 39 at the middle with a certain clearance therebetween such that they are electromagnetically coupled.

The microstripline 39 is connected to the output electrode 35b.

The ceramic package 23 is formed of a first ceramic substrate 23a and a second ceramic substrate 23b.

The first ceramic substrate 23a has a recessed portion 23c, and external terminals 23d are formed around the recessed portion 23c. A conductor 23e is formed at the bottom of the recessed portion 23c.

The second ceramic substrate 23b has a hole 23f larger than the recessed portion 23c of the first ceramic substrate 23a and is laminated such that the recessed portion 23c of the first ceramic substrate 23a and the external terminals 23d are exposed by the hole 23f.

The dielectric substrate 22 is accommodated into the hole 23f with the insulating layer 22c being placed downward such that the input and output electrodes, the bias electrode, and the ground electrode are connected to the external terminals 23d. And then the dielectric substrate 22 is sealed by a metal plate (not shown).

With the above structure, the varactor diode 29 changes its capacitance according to the applied voltage, and hence the resonant frequency of the resonator formed of the openings of the conductor 22a and 22b and the dielectric substrate 22 disposed therebetween is changed. The oscillation frequency changes accordingly.

As described above, since the structure of the present embodiment can have a much thinner resonator than that having a conventional structure, the height of the voltage-controlled oscillator is also lowered as compared with that having a conventional structure. Because the resonator can be disposed closer to the microstripline 24 serving as the main line and the microstripline 25 serving as a sub line than those in a conventional structure, stronger input and output coupling is obtained. Since the insulating layer 22c is formed of a thin film, its thickness can easily be controlled and the distance from the microstriplines to the resonator can be specified with high precision. Since the insulating layer is made from a material having a low dielectric constant such as polytetrafluoroethylene as compared with the dielectric substrate having a high dielectric constant, the deterioration of the characteristics caused by unnecessary coupling between the conductors and the input and output electrodes can be prevented. Because the resonator according to the present embodiment has a better energy-trapping capability than a conventional $TE_{01\delta}$-mode dielectric resonator, the electromagnetic field of the resonator does not generate unnecessary coupling with components and lines other than the microstripline 24 serving as the main line and the microstripline 25 serving as a sub line. Therefore, patterns can be designed with a higher degree of freedom than a conventional design. In the present embodiment, since the input and output electrodes, the bias electrode, and the ground electrode are directly connected to the external terminals of the ceramic package, bonding wire becomes unnecessary and unwanted inductance at high frequencies can be eliminated.

The voltage-controlled oscillator has been described in the present embodiment. The present invention is not limited to this case. The present invention can also be applied to a usual oscillator having no control function.

Figure 4:
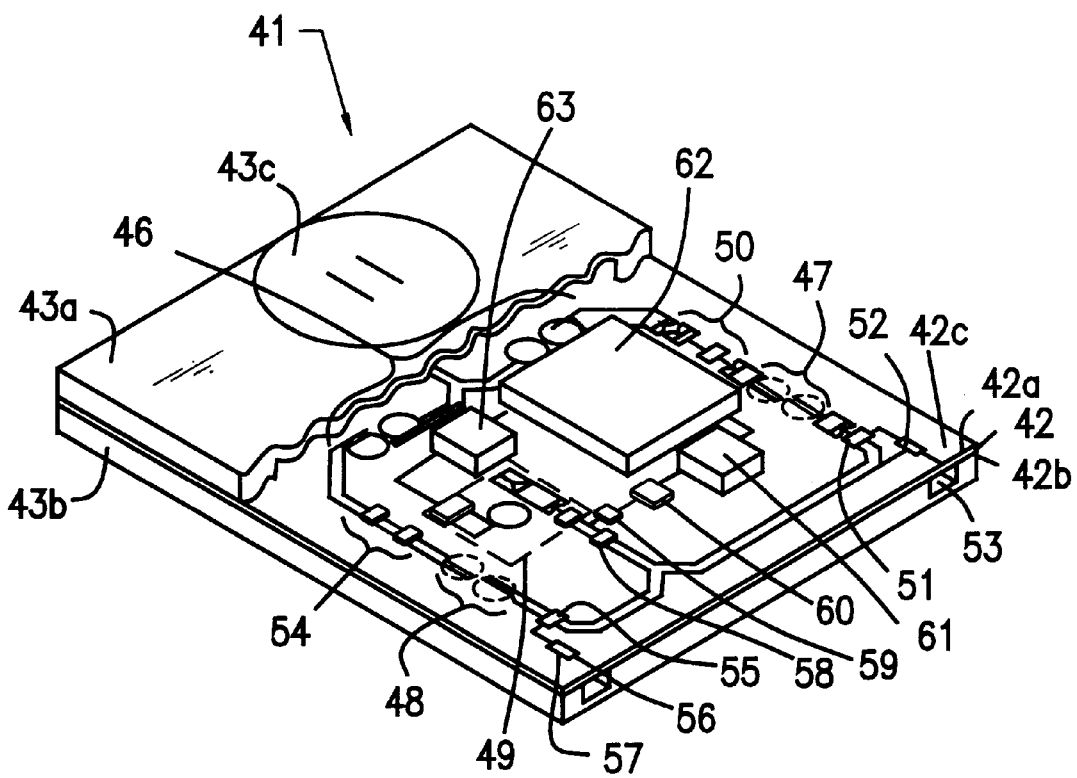
FIG. 4 is a partially broken-away perspective view of a transmission and receiving module according to a third embodiment.
Figure 5:
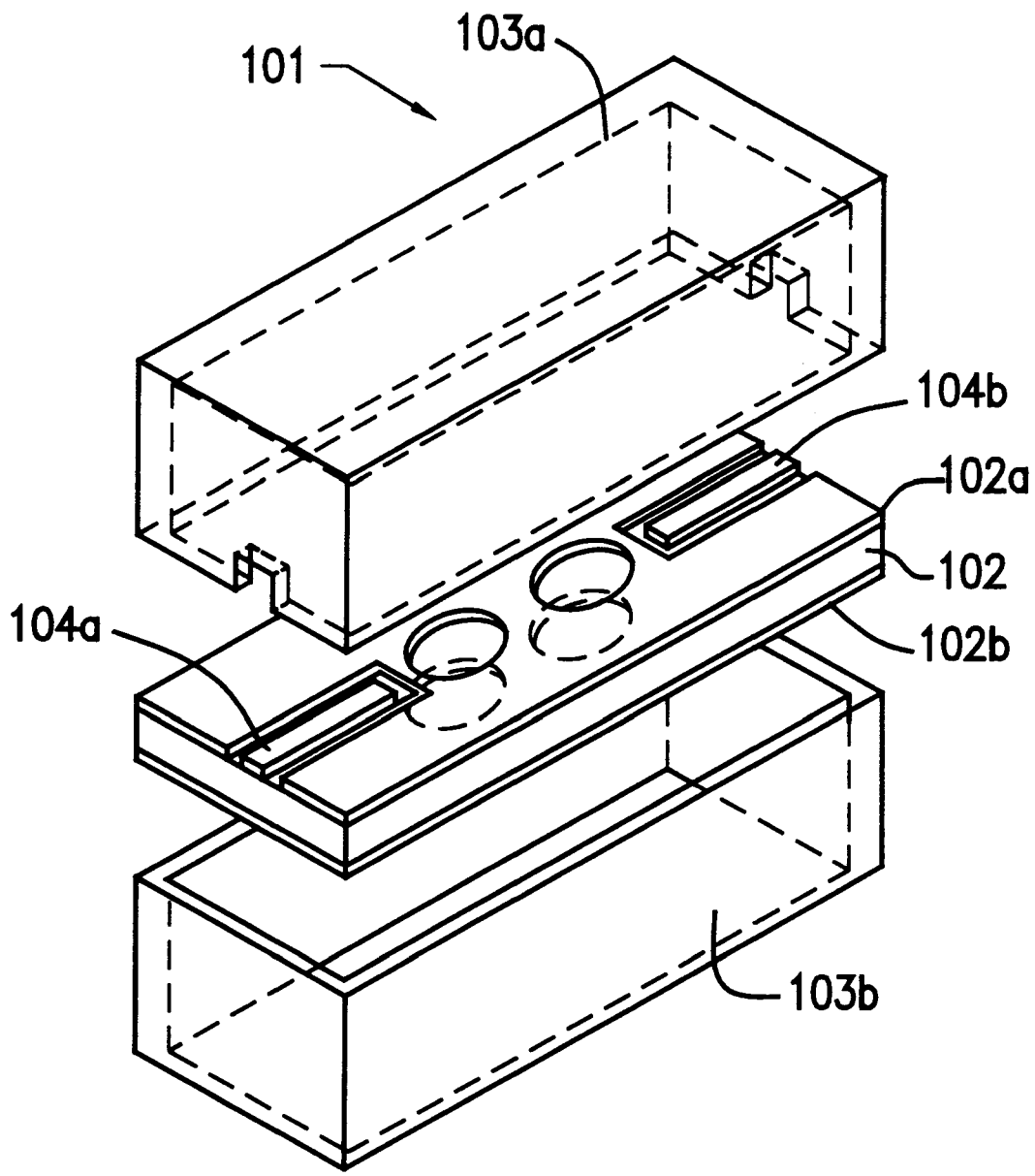
FIG. 5 is an exploded perspective view of a known dielectric filter.
Figure 6:
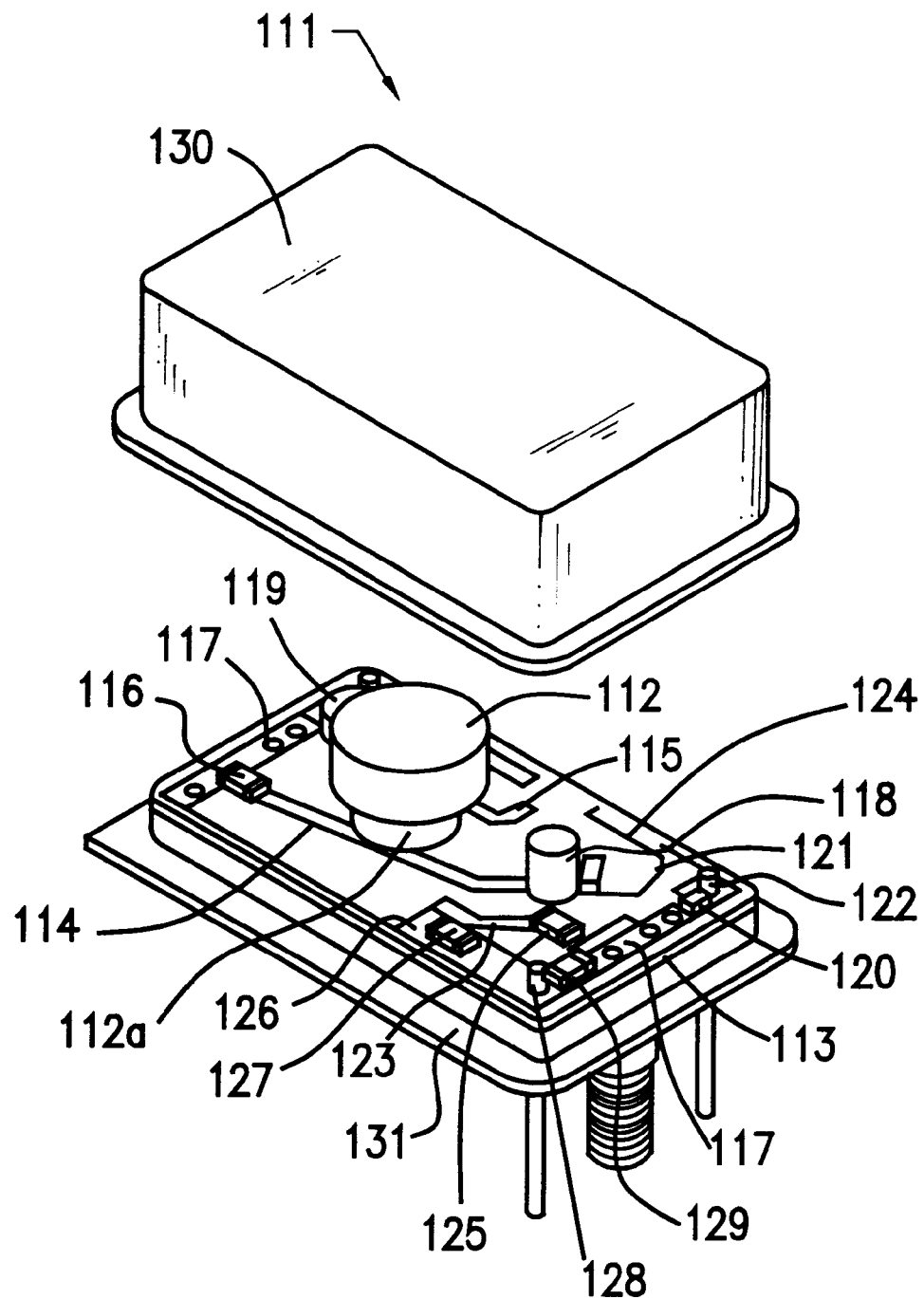
FIG. 6 is an exploded perspective view of a voltage-controlled oscillator using a conventional dielectric resonator.

A third embodiment will be described below by referring to FIG. 4. FIG. 4 is an exploded perspective view of a transmission and receiving module 41 according to the third embodiment.

As shown in FIG. 4, the transmission and receiving module 41 is formed of a dielectric substrate 42 and electrically conductive plates 43a and 43b.

On both main surfaces of the dielectric substrate 42 having a certain dielectric constant, electrodes 42a and 42b each having nine circular openings are formed such that the openings on both main surfaces oppose each other. These nine opposing openings and the dielectric substrate 42 sandwiched thereby serve as resonators and are used for a duplexer 46, band-pass filters 47 and 48, and a voltage-controlled oscillator 49. The sizes of the openings of the conductors 42a and 42b of the dielectric substrate 42 are set according to the specified frequency.

On the conductor 42a of the dielectric substrate 42, an insulating layer 42c having a low dielectric constant, such as polytetrafluoroethylene, is formed.

On the insulating layer 42c, wiring patterns are formed to connect each circuit.

A slot antenna 43c is formed on the electrically conductive plate 43a.

The slot antenna 43c is connected to the duplexer 46.

The duplexer 46 uses four of the above nine resonators. Two of the four resonators form a transmission filter, and the other two form a receiving filter.

The receiving filter of the duplexer 46 is connected to a low-noise amplifier 50. The low-noise amplifier 50 is connected to the band-pass filter 47. The band-pass filter 47 is connected to a mixer 51. The mixer 51 combines a receiving signal from the band-pass filter 47 and a local signal from the voltage-controlled oscillator 49 and outputs to a receiving terminal 53 through a band-pass filter 52.

The transmission filter of the duplexer 46 is connected to a power amplifier 54. The power amplifier 54 is connected to the band-pass filter 48. The band-pass filter 48 is connected to a mixer 55. The mixer 55 combines a transmission signal input through a band-pass filter 57 from a transmission terminal 56 and a local signal from the voltage-controlled oscillator 49 and inputs to the band-pass filter 48.

The voltage-controlled oscillator 49 is connected to diodes 58 and 59. The diode 58 is connected to the mixers 51 and 55, and the diode 59 is connected to a phase locked loop IC 62 through two pre-scalers 60 and 61. The phase locked loop IC 62 is connected to the voltage-controlled oscillator 49 through a low-pass filter 63.

With this structure, the transmission and receiving module can be integrated and made compact.

The present invention is not limited to the first to the third embodiments. It can be applied to any apparatus using a resonator.

Figure 7:
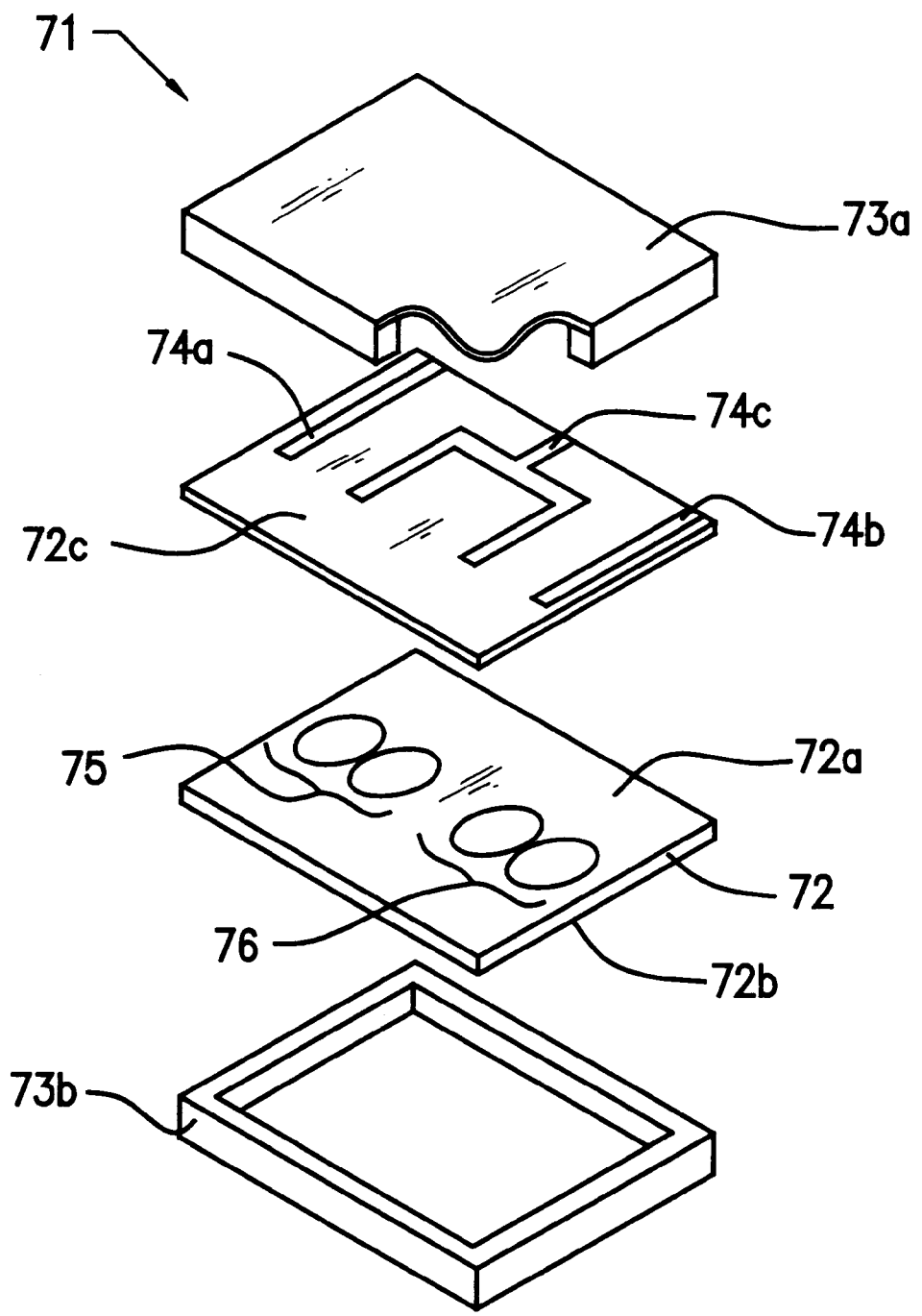
FIG. 7 is an exploded perspective view of a dielectric duplexer according to another embodiment of the invention.

A fourth embodiment of the present invention will be described by referring to FIG. 7. FIG. 7 is an exploded perspective view of a dielectric duplexer according to the fourth embodiment of the present invention.

As shown in FIG. 7, a dielectric duplexer 71 includes a dielectric substrate 72 and electrically conductive plates 73a and 73b.

The dielectric substrate 72 has a certain relative dielectric constant. It is provided on its both main surfaces with conductors 72a and 72b both having four circular openings such that the openings on both main surfaces are opposed to each other. The sizes of the openings of the conductors 72a and 72b on the dielectric substrate 72 are set according to the specified frequency.

With this structure, since the openings of the conductors 72a and 72b and the dielectric substrate sandwiched thereby resonate, four resonant sections are formed. Among these four resonant sections, two sections form a first resonant section group 75 and serve as a transmitting filter. The remaining two sections form a second resonant section group 76 and serve as a receiving filter.

On the conductor 72a of the dielectric substrate 72, an insulating layer 72c is formed by a thin-film forming technology. The insulating layer 72c is made from a material having a low dielectric constant, such as polytetrafluoroethylene. On the insulating layer 72c, an input electrode 74a, an output electrode 74b, and an antenna electrode 74c are formed.

The input electrode 74a is electromagnetically coupled with the first resonant section group 75 and serves as the input electrode of the transmitting filter. The antenna electrode 74c is electromagnetically coupled with the first resonant section group 75 and serves as the output electrode of the transmitting filter. The antenna electrode 74c is also electromagnetically coupled with the second resonant section group 76 and serves as the input electrode of the receiving filter. The output electrode 74b is magnetoelectrically coupled with the second resonant section group 76 and serves as the output electrode of the receiving filter.

The electrically conductive plates 73a and 73b are disposed and secured such that they sandwich the dielectric substrate 72 with gaps therebetween provided at portions including the openings. The input electrode 74a, the output electrode 74b, and the antenna electrode 74c are insulated from the electrically conductive plates 73a and 73b, but led between them.

With this structure, a dielectric duplexer formed of the transmitting filter including two-stage resonant sections and the receiving filter including two-stage resonant sections is obtained. Since in the structure of the present embodiment the input and output electrodes are disposed closer to the openings than in a conventional structure, stronger input and output coupling is obtained. Because the insulating layer 72c is formed of thin film, its thickness can easily be controlled and the distance from the input and output electrodes to the resonant sections can be set with high precision. Therefore, the distance between the transmitting filter and the receiving filter can be set with high precision, and unnecessary coupling therebetween can be avoided.

Since the insulating layer is made from a material having a low dielectric constant such as polytetrafluoroethylene as compared with the dielectric substrate having a high dielectric constant, the deterioration of the characteristics caused by unnecessary coupling between the conductors and the input and output electrodes can be prevented.

Figure 8:
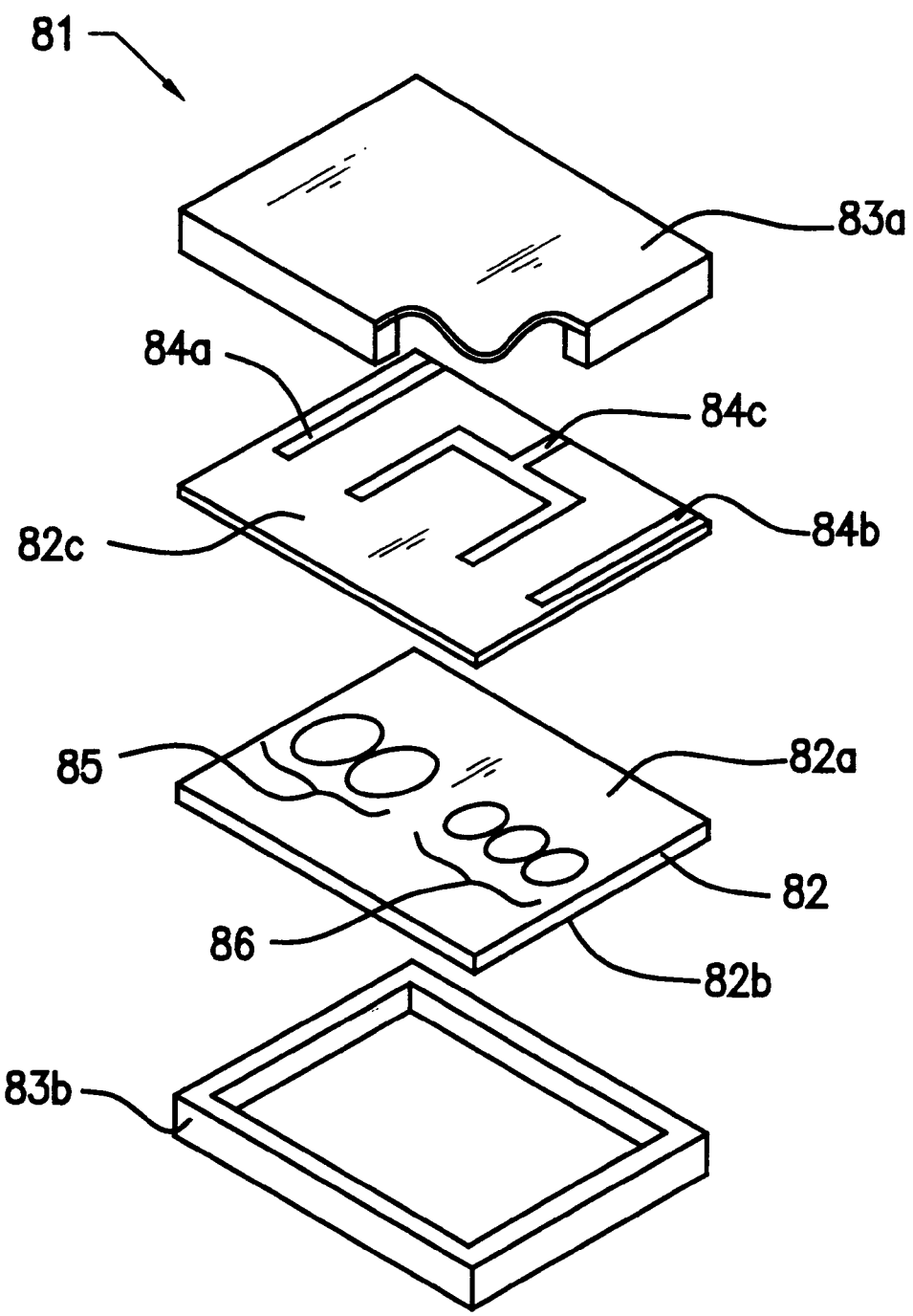
FIG. 8 is an exploded perspective view of a another type of dielectric according to a further embodiment of the invention.

A modification of the fourth embodiment will be described below by referring to FIG. 8. A dielectric duplexer 81 according to the modification differs from the dielectric duplexer 71 shown in FIG. 7 in that the shape of a first resonant section group 85 serving as a transmitting filter is different from that of a second resonant section group 86 serving as a receiving filter.

In other words, the size of each of two resonant sections forming the first resonant section group is set larger than that of each of three resonant sections forming the second resonant section group.

Since the shape of the first resonant section group 85 serving as the transmitting filter is different from that of the second resonant section group 86 serving as the receiving filter, the pass bands of the transmitting filter and the receiving filter differ.

In the present modification, the size of the first resonant section group serving as the transmitting filter is set larger than that of the second resonant section group serving as the receiving filter. The present invention is not limited to this size relationship. The size of the first resonant section group may be set smaller than that of the second resonant section group.

In the present modification, since the size of the first resonant section group is set different from that of the second resonant section group, the pass bands of the transmitting filter and the receiving filter differ. The present invention is not limited to this method. A dielectric duplexer may be formed, for example, such that the shape of the openings in the first resonant section group is set rectangular and the shape of the openings in the second resonant section group is set circular so that the pass bands of the transmitting filter and the receiving filter differ.

What is claimed is:

1. A dielectric resonator comprising:
   a dielectric substrate;
   a first conductor formed on one main surface of said dielectric substrate;
   a second conductor formed on the other main surface of said dielectric substrate;
   a first opening formed in said first conductor such that said dielectric substrate is exposed through said first conductor;
   a second opening formed in said second conductor such that said dielectric substrate is exposed through said second conductor;
   said dielectric substrate between said first and second openings forming said resonator;
   a first electrically conductive plate disposed with a gap from said first conductor so as to cover at least said first opening;
   a second electrically conductive plate disposed with a gap from said second conductor so as to cover at least said second opening;
   an insulating member formed on at least one of said first conductor and said second conductor; and
   a signal input/output electrode formed on said insulating member and electromagnetically coupled to said resonator.

2. A dielectric resonator according to claim 1, wherein said insulating member is a thin film.

3. A dielectric resonator comprising:
   a dielectric substrate;
   a first conductor formed on one main surface of said dielectric substrate;
   a second conductor formed on the other main surface of said dielectric substrate;
   a first opening formed in said first conductor such that said dielectric substrate is exposed through said first conductor;
   a second opening formed in said second conductor such that said dielectric substrate is exposed through said second conductor;
   a first electrically conductive plate disposed with a gap from said first conductor so as to cover at least said first opening;
   a second electrically conductive plate disposed with a gap from said second conductor so as to cover at least said second opening;
   an insulating member formed on at least one of said first conductor and said second conductor; and
   a wiring electrode formed on said insulating member;
   wherein said wiring electrode is formed so as to overlap with at least one of said first opening and said second opening.

4. A dielectric resonator according to claim 1, wherein said insulating member is made from a material having a lower dielectric constant than that of said dielectric substrate.

5. A dielectric resonator comprising:

a dielectric substrate;

a first conductor formed on one main surface of said dielectric substrate;

a second conductor formed on the other main surface of said dielectric substrate;

a first opening formed in said first conductor such that said dielectric substrate is exposed through said first conductor;

a second opening formed in said second conductor such that said dielectric substrate is exposed through said second conductor;

a first electrically conductive plate disposed with a gap from said first conductor so as to cover at least said first opening;

a second electrically conductive plate disposed with a gap from said second conductor so as to cover at least said second opening;

an insulating member formed on at least one of said first conductor and said second conductor; and a wiring electrode formed on said insulating member;

wherein said second electrically conductive plate includes a first ceramic substrate in which an external terminal is formed, a recessed portion is formed at a position different from said external terminal, and an electrically conductive member is formed at the bottom of said recessed portion; a second ceramic substrate which has a hole larger than the recessed portion of said first ceramic substrate and which is laminated on said first ceramic substrate such that the external terminal and the recessed portion of said first ceramic substrate are exposed by said hole; and an accommodation section formed on the recessed portion of said first ceramic substrate and the hole of said second ceramic substrate, said dielectric substrate being accommodated therein with the surface on which said wiring electrode is formed being placed downward such that a part of said wiring electrode is directly connected to said external terminal.

6. A high-frequency module comprising:

a dielectric substrate;

a first conductor formed on one main surface of said dielectric substrate;

a second conductor formed on the other main surface of said dielectric substrate;

a first opening formed in said first conductor;

a second opening formed in said second conductor;

said dielectric substrate between said first and second openings forming a resonator;

a first electrically conductive plate disposed with a gap from said first conductor so as to cover at least said first opening;

a second electrically conductive plate disposed with a gap from said second conductor so as to cover at least said second opening;

an insulating member formed on at least one of said first conductor and said second conductor;

a signal input/output electrode formed on said insulating member and electromagnetically coupled to said resonator; and an electronic component connected to said signal input/output electrode.

7. A high-frequency module according to claim 6, wherein said insulating member is a thin film.

8. A high-frequency module comprising:

a dielectric substrate;

a first conductor formed on one main surface of said dielectric substrate;

a second conductor formed on the other main surface of said dielectric substrate;

a first opening formed in said first conductor;

a second opening formed in said second conductor;

a first electrically conductive plate disposed with a gap from said first conductor so as to cover at least said first opening;

a second electrically conductive plate disposed with a gap from said second conductor so as to cover at least said second opening;

an insulating member formed on at least one of said first conductor and said second conductor;

a wiring electrode formed on said insulating member; and an electronic component connected to said wiring electrode;

wherein said wiring electrode is formed so as to overlap with at least one of said first opening and said second opening.

9. A high-frequency module according to claim 6, wherein said insulating member is made from a material having a lower dielectric constant than that of said dielectric substrate.

10. A high-frequency module comprising:

a dielectric substrate;

a first conductor formed on one main surface of said dielectric substrate;

a second conductor formed on the other main surface of said dielectric substrate;

a first opening formed in said first conductor;

a second opening formed in said second conductor;

a first electrically conductive plate disposed with a gap from said first conductor so as to cover at least said first opening;

a second electrically conductive plate disposed with a gap from said second conductor so as to cover at least said second opening;

an insulating member formed on at least one of said first conductor and said second conductor;

a wiring electrode formed on said insulating member; and an electronic component connected to said wiring electrode;

wherein said second electrically conductive plate includes a first ceramic substrate in which an external terminal is formed, a recessed portion is formed at a position different from said external terminal, and an electrically conductive member is formed at the bottom of said recessed portion; a second ceramic substrate which has a hole larger than the recessed portion of said first ceramic substrate and which is laminated on said first ceramic substrate such that the external terminal and the recessed portion of said first ceramic substrate are exposed by said hole; and an accommodation section formed of the recessed portion of said first ceramic substrate and the hole of said second ceramic substrate, said dielectric substrate being accommodated therein with the surface on which said wiring electrode is formed being placed downward such that a part of said wiring electrode is directly connected to said external terminal.

11. A dielectric filter comprising:

a dielectric substrate;

a first conductor formed on one main surface of said dielectric substrate;

a second conductor formed on the other main surface of said dielectric substrate;

a first opening formed in said first conductor;

a second opening formed in said second conductor;

a first electrically conductive plate disposed with a gap from said first conductor so as to cover at least said first opening;

a second electrically conductive plate disposed with a gap from said second conductor so as to cover at least said second opening;

a resonant section determined by said first opening and said second opening;

an insulating member formed on at least one of said first conductor and said second conductor; and input and output electrodes formed on said insulating member and electromagnetically coupled with said resonant section.

12. A dielectric filter according to claim 11, wherein said insulating member is a thin film.

13. A dielectric filter comprising:

a dielectric substrate;

a first conductor formed on one main surface of said dielectric substrate;

a second conductor formed on the other main surface of said dielectric substrate;

a first opening formed in said first conductor;

a second opening formed in said second conductor;

a first electrically conductive plate disposed with a gap from said first conductor so as to cover at least said first opening;

a second electrically conductive plate disposed with a gap from said second conductor so as to cover at least said second opening;

a resonant section determined by said first opening and said second opening;

an insulating member formed on at least one of said first conductor and said second conductor; and input and output electrodes formed on said insulating member and electromagnetically coupled with said resonant section;

wherein said input and output electrodes are formed so as to overlap with at least one of said first opening and said second opening.

14. A dielectric filter according to claim 11, wherein said insulating member is made from a material having a lower dielectric constant than that of said dielectric substrate.

15. A dielectric filter comprising:

a dielectric substrate;

a first conductor formed on one main surface of said dielectric substrate;

a second conductor formed on the other main surface of said dielectric substrate;

a first opening formed in said first conductor;

a second opening formed in said second conductor;

a first electrically conductive plate disposed with a gap from said first conductor so as to cover at least said first opening;

a second electrically conductive plate disposed with a gap from said second conductor so as to cover at least said second opening;

a resonant section determined by said first opening and said second opening;

an insulating member formed on at least one of said first conductor and said second conductor; and input and output electrodes formed on said insulating member and electromagnetically coupled with said resonant section;

wherein said second electrically conductive plate includes a first ceramic substrate in which an external terminal is formed, a recessed portion is formed at a position different from said external terminal, and an electrically conductive member is formed at the bottom of said recessed portion; a second ceramic substrate which has a hole larger than the recessed portion of said first ceramic substrate and which is laminated on said first ceramic substrate such that the external terminal and the recessed portion of said first ceramic substrate are exposed by said hole; and an accommodation section formed of the recessed portion of said first ceramic substrate and the hole of said second ceramic substrate, said dielectric substrate being accommodated therein with the surface on which said input and output electrodes are formed being placed downward such that a part of said input and output electrodes is directly connected to said external terminal.

16. A dielectric filter according to claim 11, wherein said first opening and said second opening are formed at a plurality of places and therefore the resonant section determined by said first opening and said second opening is formed at a plurality of places.

17. A dielectric filter comprising:

a dielectric substrate;

a first conductor formed on one main surface of said dielectric substrate;

a second conductor formed on the other main surface of said dielectric substrate;

a plurality of first openings formed in said first conductor;

a plurality of second openings formed in said second conductor;

a first electrically conductive plate disposed with a gas from said first conductor so as to cover at least said first openings;

a second electrically conductive plate disposed with a gap from said second conductor so as to cover at least said second openings;

a plurality of resonant sections determined respectively by said corresponding pluralities of first openings and second openings;

an insulating member formed on at least one of said first conductor and said second conductor; and input and output electrodes formed on said insulating member and electromagnetically coupled with said resonant sections;

further comprising a coupling electrode formed on said insulating member and electromagnetically coupling between corresponding ones of the plurality of resonant sections.

18. A dielectric duplexer comprising:

a dielectric substrate;

a first conductor formed on one main surface of said dielectric substrate;

a second conductor formed on the other main surface of said dielectric substrate;

a plurality of first openings formed in said first conductor;

a plurality of second openings formed in said second conductor;

a first electrically conductive plate disposed with a gap from said first conductor so as to cover at least said plurality of first openings;

a second electrically conductive plate disposed with a gap from said second conductor so as to cover at least said plurality of second openings;

a plurality of resonant sections determined by said plurality of first openings and said plurality of second openings;

a first filter formed of a first resonant section group in said plurality of resonant sections;

a second filter formed of a second resonant section group different from said first resonant section group in said plurality of resonant sections;

an insulating member formed on at least one of said first conductor and said second conductor;

an input electrode of said first filter, formed on said insulating member;

an output electrode of said second filter, formed on said insulating member; and an antenna electrode formed on said insulating member, serving as both an output electrode of said first filter and an input electrode of said second filter.

19. A dielectric duplexer according to claim 18, wherein said insulating member is a thin film.

20. A dielectric duplexer according to claim 18, wherein said input electrode, said output electrode, and said antenna electrode are formed so as to overlap with at least one of said plurality of first openings and said plurality of second openings.

21. A dielectric duplexer according to claim 18, wherein said insulating member is made from a material having a lower dielectric constant than that of said dielectric substrate.

22. A dielectric duplexer according to claim 18, wherein said second electrically conductive plate includes a first ceramic substrate in which an external terminal is formed, a recessed portion is formed at a position different from said external terminal, and an electrically conductive member is formed at the bottom of said recessed portion; a second ceramic substrate which has a hole larger than the recessed portion of said first ceramic substrate and which is laminated on said first ceramic substrate such that the external terminal and the recessed portion of said first ceramic substrate are exposed by said hole; and an accommodation section formed of the recessed portion of said first ceramic substrate and the hole of said second ceramic substrate, said dielectric substrate being accommodated therein with the surface on which said input electrode, said output electrode, and said antenna electrode are formed being placed downward such that a part of said input electrode, said output electrode, and said antenna electrode is directly connected to said external terminal.

23. A dielectric duplexer according to claim 18, wherein the shapes of the plurality of first openings and the plurality of second openings constituting said first resonant section group differ from those of the plurality of first openings and the plurality of second openings constituting said second resonant section group.

24. An oscillator comprising:
a dielectric substrate;
a first conductor formed on one main surface of said dielectric substrate;
a second conductor formed on the other main surface of said dielectric substrate;
a first opening formed in said first conductor;
a second opening formed in said second conductor;
a first electrically conductive plate disposed with a gap from said first conductor so as to cover at least said first opening;

a second electrically conductive plate disposed with a gap from said second conductor so as to cover at least said second opening;

a resonant section determined by said first opening and said second opening;

an insulating member formed on at least one of said first conductor and said second conductor;

a main line formed on said insulating member and electromagnetically coupled with said resonant section, constituting a feedback circuit; and a negative-resistance circuit connected to said feedback circuit.

25. An oscillator according to claim 24, wherein said insulating member is a thin film.

26. An oscillator according to claim 24, wherein said main line is formed so as to overlap with at least one of said first opening and said second opening.

27. An oscillator according to claim 24, wherein said insulating member is made from a material having a lower dielectric constant than that of said dielectric substrate.

28. An oscillator according to claim 24, wherein said second electrically conductive plate includes a first ceramic substrate in which an external terminal is formed, a recessed portion is formed at a position different from said external terminal, and an electrically conductive member is formed at the bottom of said recessed portion; a second ceramic substrate which has a hole larger than the recessed portion of said first ceramic substrate and which is laminated on said first ceramic substrate such that the external terminal and the recessed portion of said first ceramic substrate are exposed by said hole; and an accommodation section formed of the recessed portion of said first ceramic substrate and the hole of said second ceramic substrate, said dielectric substrate being accommodated therein with the surface on which said main line is formed being placed downward such that a part of said main line is directly connected to said external terminal.

29. An oscillator according to claim 24, wherein said feedback circuit includes a variable oscillating-frequency circuit.

30. An oscillator according to claim 29, wherein said variable oscillating-frequency circuit is controlled by a voltage.

31. A dielectric resonator according to claim 3,
wherein said dielectric substrate between said first and second openings forms said resonator, and
wherein said wiring electrode is electromagnetically coupled to said resonator for input/output of signals.

32. A dielectric resonator according to claim 5,
wherein said dielectric substrate between said first and second openings forms said resonator, and
wherein said wiring electrode is electromagnetically coupled to said resonator for input/output of signals.

33. A high-frequency module according to claim 8,
wherein said dielectric substrate between said first and second openings forms said resonator, and
wherein said wiring electrode is electromagnetically coupled to said resonator for input/output of signals.

34. A high-frequency module according to claim 10,
wherein said dielectric substrate between said first and second openings forms said resonator, and
wherein said wiring electrode is electromagnetically coupled to said resonator for input/output of signals.

* * * * *